United States Patent [19]

Yamamoto et al.

[11] Patent Number: 5,768,325
[45] Date of Patent: Jun. 16, 1998

[54] TIME-ADJUSTABLE DELAY CIRCUIT

[75] Inventors: Rieko Yamamoto; Shinji Sato, both of Tokyo, Japan

[73] Assignee: NEC Corporation, Tokyo, Japan

[21] Appl. No.: 591,129

[22] Filed: Jan. 25, 1996

[30] Foreign Application Priority Data

Jan. 26, 1995 [JP] Japan ................... 7-010504

[51] Int. Cl.$^6$ ................................................ H04L 25/36
[52] U.S. Cl. ........................ 375/372; 365/189.04
[58] Field of Search ................ 375/372; 365/189.04, 365/221, 236, 233, 194, 189.07; 370/108

[56] References Cited

U.S. PATENT DOCUMENTS

| | | | |
|---|---|---|---|
| 4,506,348 | 3/1985 | Miller et al. | 365/73 |
| 4,740,924 | 4/1988 | Tielert | 365/194 |
| 4,876,670 | 10/1989 | Nakabayashi et al. | 365/194 |
| 4,953,128 | 8/1990 | Kawai et al. | 365/194 |
| 4,961,169 | 10/1990 | Matsumura et al. | 365/189.12 |
| 5,073,733 | 12/1991 | Tanno et al. | 327/261 |
| 5,406,518 | 4/1995 | Sun et al. | 365/194 |

OTHER PUBLICATIONS

MOS Integrated Circuit (μPD42101), *High–Speed Line Buffer for NTSC TV*, NEC Corporation, 1989.

*Primary Examiner*—Stephen Chin
*Assistant Examiner*—Betsy L. Deppe
*Attorney, Agent, or Firm*—Scully, Scott, Murphy & Presser

[57] ABSTRACT

A delay circuit externally adjustable for the delay time "n" as desired, which comprises a FIFO (FIRST-IN, FIRST-OUT) type memory, a self-load counter, and a decoder circuit. In addition to a data signal, an input clock is inputted to the memory as the write clock and the read clock. The self-load counter operates in synchronization with the input clock, and loads a setting of a load value-designating signal at a prescribed number of counts. The decoder circuit receives the output of the self-load counter which has a prescribed cycle, and outputs a reset signal with the same cycle to the memory. This cycle determines the delay time. The delay circuit allows a greatly reduced number of ICs used as compared with the prior art, even for increased delay times.

3 Claims, 4 Drawing Sheets

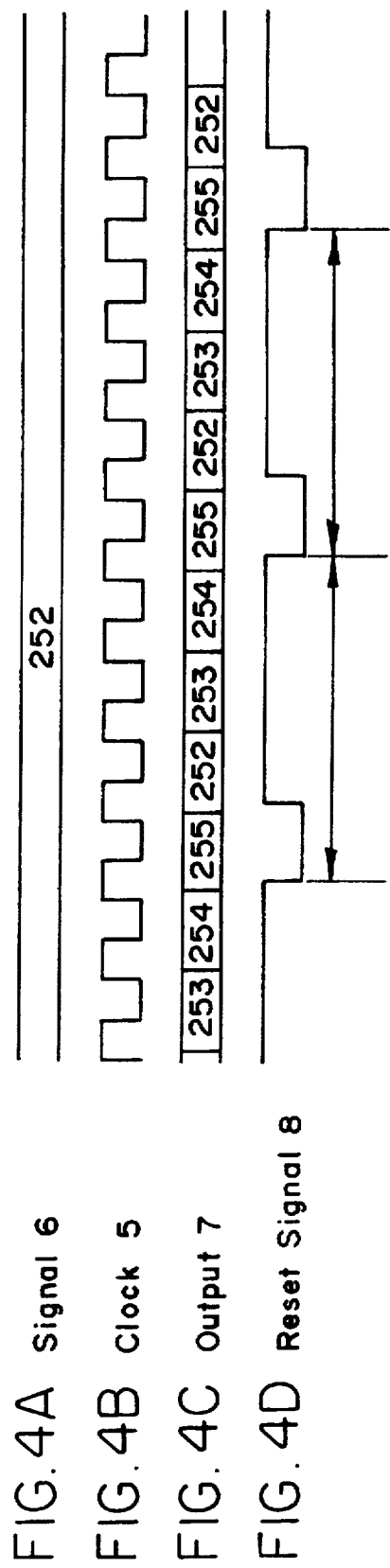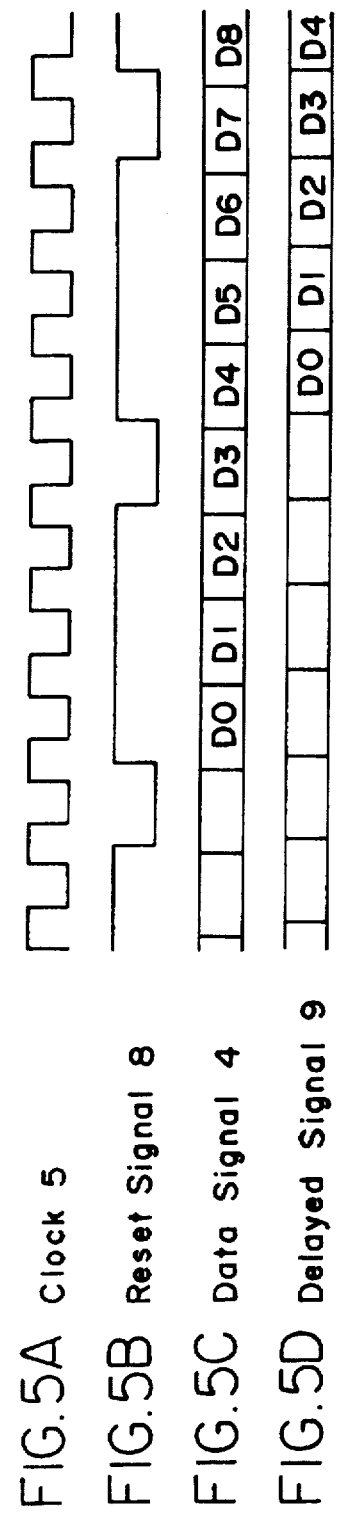

TIME-ADJUSTABLE DELAY CIRCUIT

BACKGROUND OF THE INVENTION

Field of the Invention

The present invention relates to a delay circuit, and more particularly to a delay circuit which allows delaying of data signals inputted in synchronization with a clock, by a desired number of clocks on a clock-by-clock basis.

With delay circuits of the prior art, a clock and a data signal synchronized with the clock are inputted to a shift register, and this shift register outputs N (N is a positive integer) serial data signals delayed on a clock-by-clock basis. These N serial data signals consist of a data signal delayed one clock to a data signal delayed N clocks behind the input data signal.

The N serial data signals mentioned above are then inputted to a selector circuit, and a selection control signal is inputted to the selector circuit as well. The selector circuit selects and outputs a single data signal having a delay time designated by the selection control signal among the N serial data signals.

With the conventional delay circuits as mentioned above, however, N serial data signals delayed from one to N clocks behind an input data signal on a clock-by-clock basis must be prepared in advance, and a single data signal selected from among them is outputted. This presents the problem that the circuit size increases as the delay time increases.

For example, in cases where an 8-bit shift register is used as the shift register, and an 8-1 selector which selects a single data signal from eight data signals is used as the selector circuit, increase in the delay time "n" results in a drastic increase in the total number of ICs used, as shown in the following Table 1:

TABLE 1

| n | No. of Shift Registers | No. of Selector Circuits (Selectors) | Total No. of ICs |
|---|---|---|---|
| 8 | 1 | 1 | 2 |
| 16 | 2 | 3 | 5 |
| 24 | 3 | 4 | 7 |
| 32 | 4 | 5 | 9 |
| 40 | 5 | 6 | 11 |
| 48 | 6 | 7 | 13 |
| 56 | 7 | 8 | 15 |
| 64 | 8 | 9 | 17 |
| 72 | 9 | 12 | 21 |
| 80 | 10 | 13 | 23 |

SUMMARY OF THE INVENTION

It is an object of the present invention to provide a delay circuit which delays a data signal inputted in synchronization with a clock by a desired delay time "n" (n clocks) by external setting, without increasing the circuit size even for an increased delay time "n".

In order to accomplish this object, the delay circuit according to the present invention comprises a memory, a self-load counter, and a decoder circuit. The memory, to which an input clock is inputted as the write clock and the read clock, stores input data signals in synchronization with the write clock, and outputs the input data signals in order of storage, synchronized with the read clock. The self-load counter operates under the control of the input clock mentioned above, and loads a setting of a load value-designating signal at a prescribed number of counts. The decoder circuit receives outputs of the self-load counter, and outputs a "0" in cases where the output matches the prescribed number of counts mentioned above, and a "1" for other numbers of counts. These outputs are inputted to the memory mentioned above as the write address reset signal and the read address reset signal for the memory.

With this configuration of the circuit, the delay circuit according to the present invention avoids the necessity for increasing the number of ICs to be used even for increased delay times.

BRIEF DESCRIPTION OF THE DRAWINGS

The above and other objects, features and advantages of the present invention will become apparent from the following detailed description when taken with the accompanying drawings in which:

FIG. 4A through FIG. 4D are time charts illustrative of the operation of the delay circuit shown in FIG. 3; and FIG. 5A through FIG. 5D are additional time charts illustrative of the operation of the delay circuit shown in FIG. 3.

DETAILED DESCRIPTION OF THE PREFERRED EMBODIMENTS

First, a brief explanation will be given regarding a delay circuit of the prior art, with reference to FIG. 1 and FIG. 2A through FIG. 2G.

Figure 1:
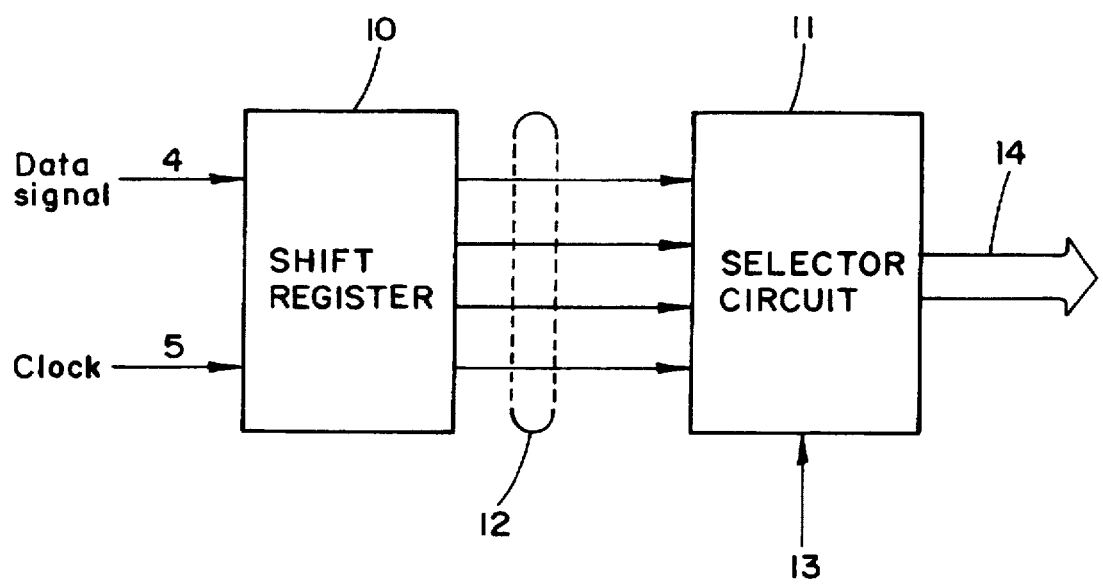
FIG. 1 is a block diagram illustrative of a delay circuit according to the prior art.
Figure 2:
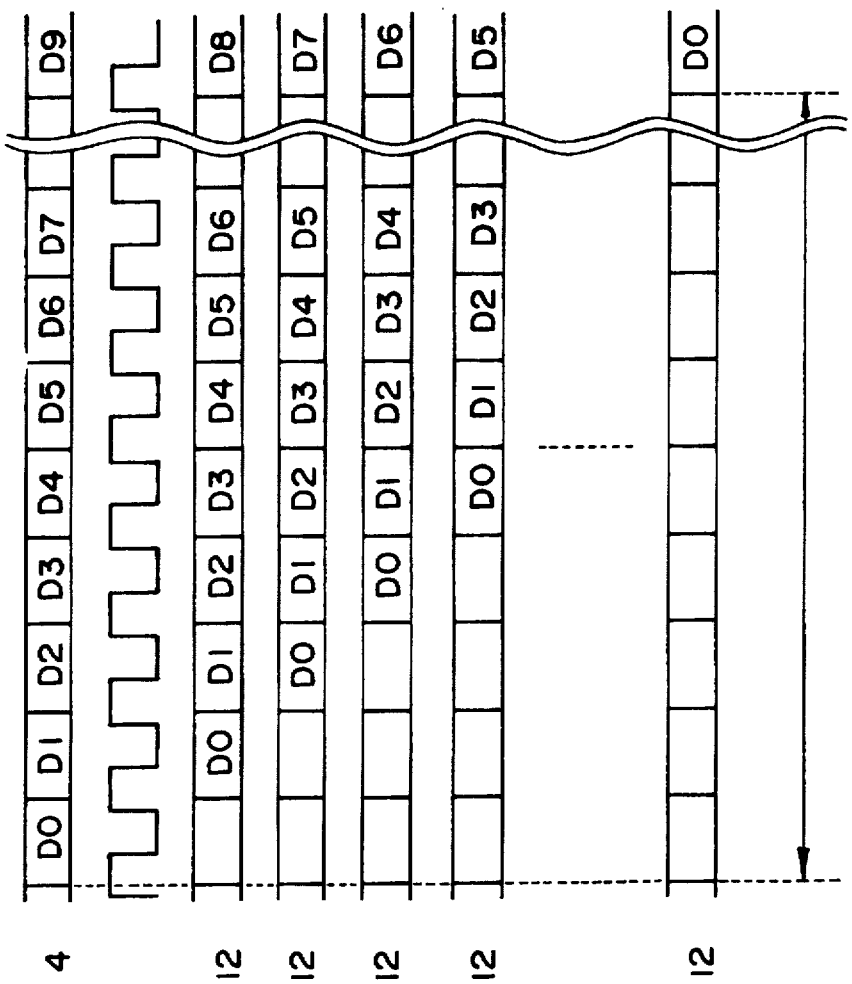
FIG. 2A through FIG. 2G are time charts for the delay circuit according to the prior art.

In FIG. 1, a clock 5 and a data signal 4 in synchronization with the clock 5 are inputted to a shift register 10, and this shift register 10 outputs a total of N serial data signals 12 delayed on a clock-by-clock basis behind the data signal 4. These N serial data signals 12 are inputted to a selector circuit 11. A selection control signal 13 is inputted to this selector circuit 11, and a single serial data signal among the N serial data signals 12 which has been delayed by the delay time set by the selection control signal 13 is outputted as an output data signal 14. That is, the setting of the selection control signal 13 determines the delay time.

FIG. 2A through FIG. 2G illustrate the data signal 4, the clock 5, and the N serial data signals 12 shown in FIG. 1. A single data signal determined by the selection control signal 13 is selected from among the N serial data signals 12.

Figure 3:
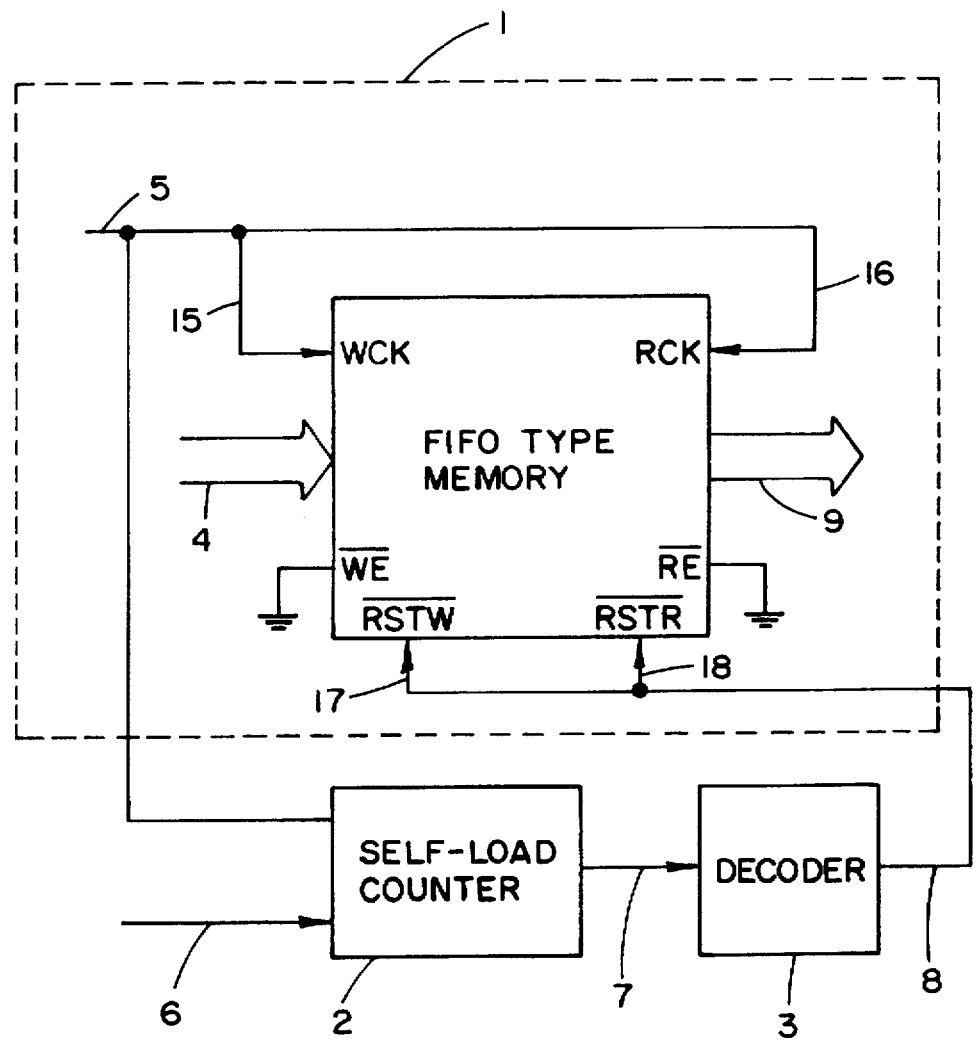
FIG. 3 is a block diagram illustrative of an embodiment of the delay circuit according to the present invention.

An embodiment of the delay circuit according to the present invention will now be explained. FIG. 3 is a block diagram illustrative of an embodiment of the delay circuit according to the present invention. In addition, FIG. 4A through FIG. 4D, and FIG. 5A through FIG. 5D are time charts illustrative of the operation of the delay circuit shown in FIG. 3.

First, the FIFO (FIRST-IN, FIRST-OUT) type memory 1 shown in the block diagram designated as FIG. 3 is a publicly known MOS IC (μPD42101) manufactured by NEC CORPORATION. As described in the data book thereon, this IC may be configured as illustrated in FIG. 3, and reset in a given cycle for its use as a delay line with delay bit numbers matching the cycles of reset signals (RSTW, RSTR). An input data signal 4 is inputted to the memory 1, a clock 5 functioning as the write clock (WCK)

15 is inputted to the input buffer and the write address pointer of the memory 1, and the same clock 5 functioning as the read clock (RCK) 16 is inputted to the output buffer and the read address pointer of the memory 1. The input data 4 are stored in sequential order, synchronized with the write clock 15, and the stored input data 4 are outputted in order of storage, in response to the read clock 16.

The clock 5 is also inputted to an 8-bit counter which serves as a self-load counter 2. This self-load counter 2 operates under the control of the clock 5, and automatically loads a setting of a load value-designating signal 6 when the number of counts has attained a full count. The output 7 of the number of counts by the counter 2 is inputted to a decoder circuit 3. The output of the decoder circuit 3 is then inputted to the FIFO type memory 1 as the write reset signal 17 and the read reset signal 18.

The operation of the delay circuit shown in FIG. 3 will now be explained with reference to FIG. 4A through FIG. 4D, and FIG. 5A through FIG. 5D. The FIFO type memory 1 (μPD42101 manufactured by NEC CORPORATION) operates as a delay circuit which produces a delay time determined by the reset cycle of the reset signal 8 in cases where the same clock is used as the write clock 15 and the read clock 16, and the same reset signal is used as the write address reset signal (RSTW) 17 and the read address reset signal (RSTR) 18. Accordingly, any desired delay time with an upper limit determined by the capacity of the memory cell array of the FIFO type memory 1 may be set by externally varying the reset cycles of the write address reset signal 17 and the read address reset signal 18.

In order to generate a reset signal with a freely changeable reset cycle, the present invention provides the self-load counter 2 and the decoder circuit 3 as the characteristic members, and the load value-designating signal 6 indicative of the delay time "n" is inputted to the self-load counter 2.

FIG. 4A through FIG. 4D are time charts illustrative of the operations of the self-load counter 2 and the decoder circuit 3. On the other hand, FIG. 5A through FIG. 5D are time charts illustrative of the delaying operation. According to the present embodiment, the self-load counter 2 is an 8-bit counter, and the setting of the load value-designating signal 6 is "252". The counter 2 counts the clock 5, and the value "252" of the load value-designating signal 6 is loaded in case that the full count "255" is reached. Thereafter, the output 7 of the counter 2 ranges over the four values from "252" to "255", the full count value of the 8-bit counter. The output 7 of the counter 2 ranging over these four values is inputted to the decoder circuit 3.

The decoder circuit 3 outputs a "0" in case that the value of the output 7 of the counter 2 is the full count "255", or a "1" in other cases. As a result, a reset signal 8 with a 4-clock wide cycle is generated. This reset signal 8 is inputted to the FIFO type memory 1 as the write address reset signal 17 and the read address reset signal 18.

As illustrated in FIG. 5A through FIG. 5D, the reset signal 8 synchronized with the clock 5 is simultaneously inputted to the write address pointer and the read address pointer of the FIFO type memory 1 as the write address reset signal 17 and the read address reset signal 18, respectively, and these pointers are initialized at the time of the initial "0" (L-state). Input data signals 4 for four clocks are written in synchronization with the clock 5 starting with the next clock. The pointers are reinitialized in response to the reset signal 8 at the fourth clock, and writing of the subsequent data signal begins, while the already written data signals begin to be read out. Here, an output data signal 9 determined by n=4 or delayed by a 4-clock width is outputted.

Varying the value of the load value-designating signal 6 results in change of the reset cycle of the reset signal 8 as desired, and in setting a desired delay time for the input data signal 4.

The settable range of the delay time "n" may be expanded by a power of 2 by increasing the bit number of the self-load counter 2. In addition, in cases where the load value-designating signal 6 has an n-bit length, the self-load counter 2 must be an n-bit counter as well. In this case, the range of the delay time may be set up to $2^n$. In addition, assuming that the self-load counter 2 is an n bit type, the load value-designating signal 6 which sets an m-clock wide delay time is assigned a value of ($2^n$−m).

The output data signal 9 with a newly set delay time is outputted only after the varied setting of the load value-designating signal 6 is loaded into the self-load counter 2, and the reset signal 8 with a new cycle is inputted from the decoder circuit 3 to the FIFO type memory 1 as the write address reset signal 17 and the read address reset signal 18.

According to the present embodiment, the input data signal 4 is written, and the output data signal 9 is concurrently outputted, both in synchronization with the clock 5. The clock frequency is on the order of 19 MHz to 20 MHz, but is not limited thereto.

In some cases, the levels of the write clock 15, the read clock 16, the write address reset signal 17, and the read address reset signal 18 are inverted and inputted depending on the particular varieties of the FIFO type memory 1.

Regarding the ICs available for use according to the present invention, a carry-output, 4-bit counter may be used as the self-load counter 2. The FIFO type memory 1 available for use has a storage capacity on the order of 1,000 bits. The decoder circuit 3 may be an 8-input NAND circuit, and particularly a combination circuit composed of one 8-input NAND circuit and two 4-input AND circuits in cases where the delay time "n" is 257 or greater.

With these ICs, the delay time "n" and the number of ICs used are related as presented in the following Table 2:

TABLE 2

| n | No. of Counters | No. of FIFOs | No. of Decoder Circuits | Total No. of ICs |
|---|---|---|---|---|
| 16 | 1 | 1 | 1 | 3 |
| 256 | 2 | 1 | 1 | 4 |
| 1000 | 3 | 1 | 3 | 7 |

Table 2 shows greatly reduced numbers of ICs used in the delay circuits according to the present invention as compared with the numbers of the ICs used in the delay circuits of the prior art which are reported in Table 1. The effect of the present invention becomes particularly notable as the delay time increases.

As described above, the present invention allows an increased delay time "n", which may be varied as desired, to be established within the limits of the storage capacity of the used memory, with a minimum-sized circuit which does not need any additional circuit element. Even in cases where a delay time is needed which exceeds the storage capacity, all that is needed is addition of a memory, thus allowing minimization of the entire size of the circuit.

While the present invention has been described in connection with certain preferred[]embodiments, it is to be understood that the subject matter encompassed by the present invention is not limited to those specific embodiments. On the contrary, it is intended to include all alternatives, modifications, and equivalents as can be included within the spirit and scope of the following claims.

What is claimed is:

1. A time-adjustable delay circuit, comprising:

a memory to which an input clock is inputted as a write clock and a read clock, and which stores input data signals in synchronization with the write clock, and outputs the input data signals in order of storage, synchronized with the read clock;

a self-load counter which operates under the control of said input clock, said self-load counter having a prescribed number of counts and being loaded with a setting of a load value-designating signal for counting from said setting to said prescribed number of counts; and a decoder circuit which receives the output of said self-load counter, and outputs a "0" in case that said output matches said prescribed number of counts, and a "1" in case that said output is another number of counts, the output of said decoder circuit being inputted to said memory as a write address reset signal and a read address reset signal for said memory.

2. A delay circuit as claimed in claim 1, wherein said memory is a FIFO (FIRST-IN, FIRST-OUT) type memory.

3. A delay circuit as claimed in claim 2, wherein said write clock, said read clock, said write address reset signal, and said read address reset signal are inverted and inputted to said FIFO (FIRST-IN, FIRST-OUT) type memory.

* * * * *